United States Patent [19]
Poole et al.

[11] Patent Number: 5,340,013

[45] Date of Patent: Aug. 23, 1994

[54] REWORK PROCESS FOR PRINTED CIRCUIT CARDS AND SOLDER FOUNTAIN HAVING GAS BLANKET FOR CARRYING OUT THE PROCESS

[75] Inventors: Joseph D. Poole, Troutman; Frank P. Zickefoose, Charlotte, both of N.C.

[73] Assignee: International Business Machines Corporation, Armonk, N.Y.

[21] Appl. No.: 165,780

[22] Filed: Dec. 10, 1993

[51] Int. Cl.⁵ .................. H05K 3/34; B23K 3/00; B23K 31/02
[52] U.S. Cl. .................. 228/119; 228/180.1; 228/219; 228/42; 228/56.1
[58] Field of Search .............. 228/119, 180.1, 191, 228/219, 264, 20.1, 42, 56.1

[56] References Cited
U.S. PATENT DOCUMENTS

| | | | |
|---|---|---|---|
| 3,865,298 | 2/1975 | Allen et al. | 228/20.1 |
| 4,506,820 | 3/1985 | Brucker | 228/56.1 |
| 4,659,002 | 4/1987 | Wallgren et al. | 228/56.1 |

*Primary Examiner*—Samuel M. Heinrich
*Attorney, Agent, or Firm*—Richard M. Goldman

[57] ABSTRACT

Disclosed is a solder tool for reworking a pin-in-hole printed circuit board. The solder tool has means for providing a gas blanket. Also disclosed is a method of reworking a pin-in-hole printed circuit board using the solder tool.

10 Claims, 1 Drawing Sheet

REWORK PROCESS FOR PRINTED CIRCUIT CARDS AND SOLDER FOUNTAIN HAVING GAS BLANKET FOR CARRYING OUT THE PROCESS

FIELD OF THE INVENTION

This invention relates to soldering tools for use in reworking pin-in-hole printed circuit boards.

BACKGROUND OF THE INVENTION

Heretofore, reworking of printed circuit boards has involved desoldering solder bonds, removing integrated circuit chips, as necessary, and resoldering solder bonds. However, the requirements imposed upon microelectronics manufacturing by such developments as the development of high circuit density, high pin count devices with high populations of high I/O density on high circuit density packages, combined with no flux and no clean solder technologies, has imposed stringent requirements on solder process control.

One aspect of stringent process control is the exclusion of atmospheric oxygen from the molten solder, both in the solder pot and an the printed circuit card. Methods for restricting oxygen access to the molten solder in wave soldering apparatus are disclosed in, for example, U.S. Pat. No. 5,121,875 to Hagerty et al. for WAVE SOLDERING IN A PROTECTIVE ATMOSPHERE ENCLOSURE OVER A SOLDER POT, U.S. Pat. No. 5,121,874 to Deambrosio et al. for SHIELD GAS WAVE SOLDERING, U.S. Pat. No. 4,921,156 to Hohnerlein et al. for SOLDERING APPARATUS, and U.S. Pat. No. 4,538,757 to Bertiger for WAVE SOLDERING IN A REDUCING ATMOSPHERE. These patents describe various aspects of nitrogen blanketing of wave soldering during the original manufacture of printed circuit boards, including chip populating.

However, while the use of nitrogen blankets in the original manufacture of printed circuit boards is well known, there exists no teaching of soldering methods and tools for reworking pin-in-hole printed circuit boards that avoid oxidation of the solder and the workpiece during soldering. Nor is there any teaching of soldering methods and tools for reworking pin-in-hole printed circuit boards that permit the use of no-clean and even non-flux technology.

OBJECTS OF THE INVENTION

Thus, it is a primary object of the invention to provide a soldering method and tool, especially for reworking pin-in-hole printed circuit boards, that avoids oxidation of the solder and the workpiece during soldering.

It is a further object of the invention to provide a soldering method and tool, especially for reworking pin-in-hole printed circuit boards, that permits the use of no-clean and even non-flux technology.

SUMMARY OF THE INVENTION

These and other objects of the invention are achieved by the method and apparatus of the invention. According to our invention, there is provided a method of reworking printed circuit boards, especially pin-in-hole printed circuit board. The first step is desoldering the solder bonds connecting an integrated circuit chip to the printed circuit board. This may be preparatory to replacing the solder bonds or to removing and replacing the chip. Next the printed circuit board in proximity to the solder tool of the invention.

The solder tool is characterized by a gas injector that provides a localized blanket of non-reactive gas in close proximity to the solder and the printed circuit board or card. The non reactive gas can be nitrogen, carbon dioxide, hydrogen, water vapor, or an inert gas, such as argon or helium. Especially preferred is nitrogen. When nitrogen is the non-reactive gas, the blanket consists essentially of nitrogen, containing no more then about 5 volume percent oxygen, and preferably less than 100 parts per million oxygen, and in an especially preferred embodiment, less then 10 parts per million oxygen.

The process includes the step of providing the non-reactive gas blanket in proximity to the printed circuit board. This gas blanket emanates from the circumferential conduit. With protection from oxidation provided by the gas blanket it is possible to provide a fountain of molten solder to the pin-in-hole printed circuit board to resolder the integrated circuit chip thereto.

According to one preferred embodiment of the invention a no-clean flux is used on the surfaces of the pin-in-hole printed circuit board to be resoldered. Exemplary no-clean fluxes include substantially non-corrosive, substantially electrically non-conducting organic acids in an alcohol solvent. Typically, the no-clean flux is chosen from the group consisting of:

a. abietic acid and an activator in alcohol; and
 b. adipic acid in an alcohol.

The molten solder is contained within the tool in a solder pot. The solder pot has a top surface with an opening for the upward flow of solder. The solder pot also has a solder pump. This solder pump is used for pumping the molten solder upward from the solder pot through the opening in the top surface of the solder pot to the pin-in-hole printed circuit board that is being reworked.

A solder nozzle that is conjunction with the solder pump and acts as the outlet means of the solder pump extends upwardly from the solder pump through the opening in the top surface of the solder pot. This solder nozzle carries the molten solder into proximity with the pin-in-hole printed circuit board.

A circumferential conduit surrounds the solder nozzle and the opening in the top surface of the solder pot. This circumferential conduit has outlets for providing a gas blanket to the volume defined by the solder nozzle, the opening in the top surface of the solder pot, and the pin-in-hole printed circuit board. This circumferential conduit especially provides a gas blanket gas in proximity to the molten solder and the pin-in-hole printed circuit board.

THE FIGURES

The method and apparatus of our invention may be further understood by reference to the FIGURES appended hereto.

DETAILED DESCRIPTION OF THE INVENTION

Figure 1:
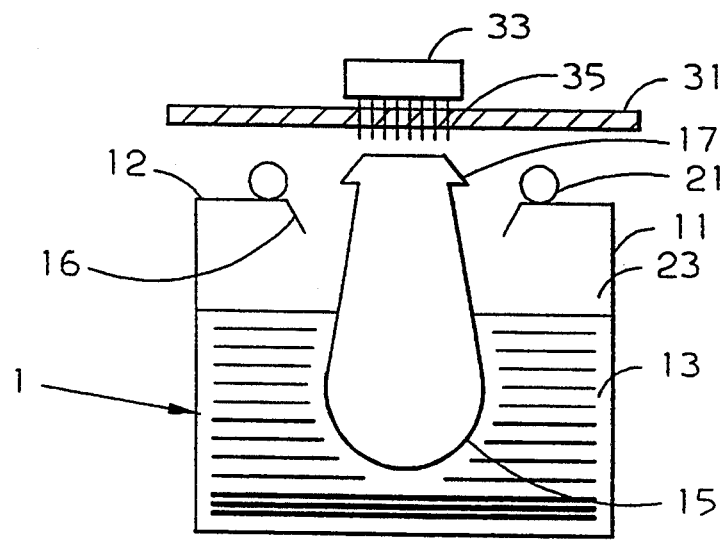
FIG. 1 is a cutaway front elevation of the solder tool of the invention.
Figure 2:
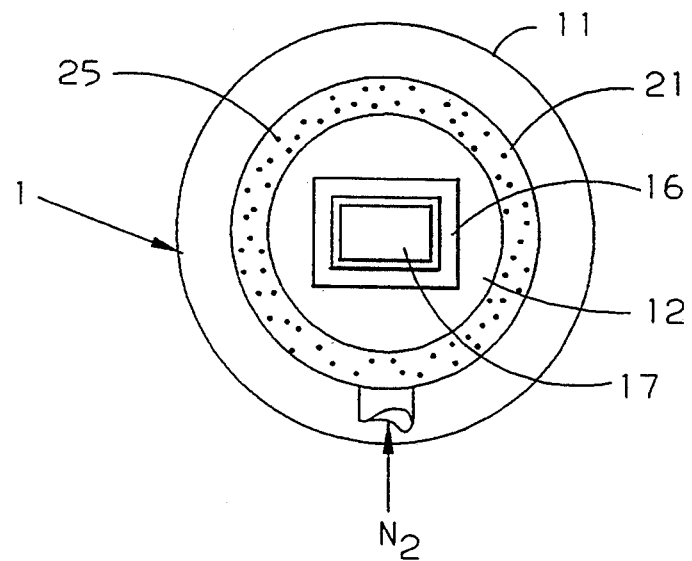
FIG. 2 is a top view of the solder tool of the invention.

According to our invention, there is provided a method of reworking printed circuit boards 31, especially pin-in-hole printed circuit boards 31. The first step is desoldering the solder bonds connecting an integrated circuit chip 33 to the printed circuit board 31. This may be preparatory to replacing the solder bonds or to removing and replacing the chip 33. Next the printed circuit board 31 is placed in proximity to the solder tool 1 of the invention. The solder tool 1 is characterized by a gas injector 21 that provides a localized blanket of non-reactive gas in close proximity to the solder and the printed circuit board or card 31.

The non reactive gas can be nitrogen, carbon dioxide, hydrogen, water vapor, or an inert gas, such as argon or helium. Especially preferred is nitrogen. When nitrogen is the non-reactive gas, the blanket consists essentially of nitrogen, containing no more then about 5 volume percent oxygen, and preferably less than 100 parts per million oxygen, and in an especially preferred embodiment, less then 10 parts per million oxygen. Thus, even after allowing for diffusion, the oxygen content of the gas in contact with the liquid solder and the reworked surface of the printed circuit board 31 or card is less then about 10 volume percent.

The molten solder 13 is contained within the tool 1 in a solder pot 11. The solder pot has a top surface 12 with an opening 16 for the upward flow of solder 13. The solder pot 11 also has a solder pump 15. This solder pump 15 is used for pumping the molten solder 13 upward from the solder pot 11 through the opening 16 in the top surface 12 of the solder pot 11 to the pin-in-hole printed circuit board 31 that is being reworked.

A solder nozzle 17 that is an adjunct of the solder pump 15 and acts as the outlet means 17 of the solder pump 15 extends upwardly from the solder pump 15 through the opening 16 in the top surface 12 of the solder pot 11. This solder nozzle 17 carries the molten solder 13 into proximity with the pin-in-hole printed circuit board 31.

A circumferential conduit 21 surrounds the solder nozzle and the opening 16 in the top surface 12 of the solder pot 11. This circumferential conduit 21 has outlets 25 for providing a gas blanket to the volume defined by the solder nozzle 17, the opening 16 in the top surface 12 of the solder pot 11, and the pin-in-hole printed circuit board 31. This circumferential conduit 21 especially provides a gas blanket gas in proximity to the molten solder 13 and the pin-in-hole printed circuit board 31.

The openings 25 in the circumferential conduit 21 can be drilled holes in a hollow pipe or tube 21 form of the circumferential conduit. Alternatively, they can be pores in a sintered circumferential conduit 21. The diameter of the circumferential conduit 21 is about 5 to 10 millimeters, and the size of the openings is from about $5 \times 10^{-4}$ mm to about 1 mm, and preferably from about 0.01 mm to about 0.1 mm.

The process includes the step of providing the non-reactive gas blanket in proximity to the printed circuit board 31. This gas blanket emanates from the circumferential conduit 21. With protection from oxidation provided by the gas blanket it is possible to provide a fountain of molten solder to the pin-in-hole printed circuit board 31 to resolder the integrated circuit chip 33 and chip leads 35 thereto.

According to one preferred embodiment of the invention a no-clean flux is used on the surfaces of the pin-in-hole printed circuit board to be resoldered. Exemplary no-clean fluxes include substantially non-corrosive, substantially electrically non-conducting, organic acids in an alcohol solvent. Typically, the no-clean flux is chosen from the group consisting of:

a. abietic acid and an activator in alcohol; and
b. adipic acid in an alcohol.

While the invention has been described with respect to certain preferred embodiments and exemplifications, it is not intended to limit the scope of the invention thereby, but solely by the claims appended hereto.

We claim:

1. A solder tool for reworking a pin-in-hole printed circuit board, said solder tool comprising:
   a. a solder pot for containing molten solder, said solder pot having a top surface with an opening in a top surface thereof for the upward flow of solder;
   b. a solder pump for pumping the molten solder upward from the solder pot through the opening in the top surface of the solder pot to the pin-in-hole printed circuit board;
   c. a solder nozzle extending upwardly from the solder pump through the opening in the top surface of the solder pot for carrying the molten solder into proximity with the pin-in-hole printed circuit board; and
   d. a circumferential conduit surrounding the solder nozzle and the opening in the top surface of the solder pot, said conduit having outlets for providing a blanket gas blanket in proximity to the solder nozzle, the opening in the top surface of the solder pot, and the pin-in-hole printed circuit board.

2. The solder tool of claim 1 wherein the circumferential conduit surrounding the solder nozzle and the opening in the top surface of the solder pot is a sintered powder conduit having pores for discharging the blanket gas.

3. The solder tool of claim 1 wherein the circumferential conduit surrounding the solder nozzle and the opening in the top surface of the solder pot is a tube having openings for discharging the blanket gas.

4. A method of reworking a pin-in-hole printed circuit board comprising the steps of:
   a. desoldering solder bonds connecting an integrated circuit chip to the printed circuit board;
   b. placing the printed circuit board in proximity to a solder tool having
      (a). a solder pot for containing molten solder, said solder pot having a top surface with an opening in a top surface thereof for the upward flow of solder;
      (b). a solder pump for pumping the molten solder upward from the solder pot through the opening in the top surface of the solder pot to the pin-in-hole printed circuit board;
      (c). a solder nozzle extending upwardly from the solder pump through the opening in the top surface of the solder pot for carrying the molten solder into proximity with the pin-in-hole printed circuit board; and
      (d). a circumferential conduit surrounding the solder nozzle and the opening in the top surface of the solder pot, said conduit having outlets for providing a blanket gas blanket in proximity to the solder nozzle, the opening in the top surface of the solder pot, and the pin-in-hole printed circuit board;
   c. providing a non-reactive gas blanket in proximity to the printed circuit board from the circumferential conduit; and
   d. providing a fountain of molten solder to the pin-in-hole printed circuit board to resolder the integrated circuit chip thereto.

5. The method of claim 4 comprising providing a no-clean flux on surfaces of the pin-in-hole printed circuit board to be resoldered.

6. The method of claim 5 wherein the no-clean flux comprises a substantially non-corrosive, substantially electrically non-conducting organic acid in an alcohol solvent.

7. The method of claim 6 wherein the no-clean flux is chosen from the group consisting of:
 a. abietic acid and an activator in alcohol; and
 b. adipic acid in an alcohol.

8. The method of claim 5 wherein the gas blanket consists essentially of a gas chosen from the group consisting of helium, argon, nitrogen, carbon dioxide, water, hydrogen, and mixtures thereof.

9. The method of claim 5 wherein the gas blanket comprises nitrogen.

10. The method of claim 8 wherein the gas blanket consists essential of nitrogen with less then 5 volume percent oxygen contained therein.

* * * * *